United States Patent [19]

Izumiya et al.

[11] Patent Number: 5,317,167
[45] Date of Patent: May 31, 1994

[54] SEMICONDUCTOR LIGHT-EMITTING DEVICE WITH INGAALP

[75] Inventors: Toshihide Izumiya, Tokyo; Yasuo Ohba, Yokohama; Ako Hatano, Tokyo, all of Japan

[73] Assignee: Kabushiki Kaisha Toshiba, Kawasaki, Japan

[21] Appl. No.: 59,221

[22] Filed: May 10, 1993

Related U.S. Application Data

[62] Division of Ser. No. 819,976, Jan. 13, 1992, Pat. No. 5,235,194, which is a division of Ser. No. 588,858, Sep. 27, 1990, Pat. No. 5,103,271.

[30] Foreign Application Priority Data

Sep. 28, 1989 [JP] Japan .................................. 1-250450
Mar. 26, 1990 [JP] Japan .................................. 2-73272

[51] Int. Cl.$^5$ ............................................. H01L 33/00
[52] U.S. Cl. ........................................ 257/13; 257/90; 257/94; 257/96; 257/97
[58] Field of Search ..................... 257/96, 97, 94, 90, 257/13

[56] References Cited

U.S. PATENT DOCUMENTS

| | | | |
|---|---|---|---|
| 5,008,718 | 4/1991 | Fletcher et al. | 257/96 |
| 5,048,035 | 9/1991 | Sugawara et al. | 257/94 X |
| 5,103,271 | 4/1992 | Izumiya et al. | 257/96 X |
| 5,164,798 | 11/1992 | Huang | 257/97 |
| 5,198,686 | 3/1993 | Yoshimura | 257/96 X |

FOREIGN PATENT DOCUMENTS 3283676 12/1991 Japan ................................. 257/96

*Primary Examiner*—William Mintel
*Attorney, Agent, or Firm*—Oblon, Spivak, McClelland, Maier & Neustadt

[57] ABSTRACT

A semiconductor light-emitting device comprises a light-emitting layer including a pn junction formed by a plurality of $In_xGa_yAl_{1-x-y}P$ ($0 \leq x$, $y \leq 1$) layers, and a light-emitting-layer holding layer consisting of an indirect transition type $Ga_{1-w}Al_wAs$ ($0 \leq w \leq 1$) provided on an opposite side to a light-outputting side. The holding layer has a sufficiently small light absorption coefficient for the light from the light-emitting layer although its band gap is small and improves the light emission efficiency of the semiconductor light-emitting device.

15 Claims, 6 Drawing Sheets

SEMICONDUCTOR LIGHT-EMITTING DEVICE WITH INGAALP

This is a division, of application Ser. No. 07/819,976, filed on Jan. 13, 1992, now U.S. Pat. No. 5,235,194, which is a division of application Ser. No. 07/588,858 filed on Sep. 27, 1990, now U.S. Pat. No. 5,103,271.

BACKGROUND OF THE INVENTION

1. Field of the Invention

The present invention relates to a semiconductor light-emitting device and a method of fabricating the same. More particularly, this invention relates to a high-brightness semiconductor light-emitting diode (LED) using a III-V group compound semiconductor which emits light in a green region, and a method of fabricating the same.

2. Description of the Related Art

During the last few years, the advancement of the information processing technology increased the demand for LEDs as a light source for optical communications, optical recording media, display and so forth. Development of green-light emitting LEDs of a short wavelength among all LEDs is strongly demanded for higher information density.

Light emission in a range from yellow to infrared has been realized using materials, such as GaAs, GaP, GaAlAs and GaInAsP. The wavelength limit of light emitted is considered to be about 700 nm. $In_xGa_yAl_{1-x-y}P$ ($0 \leq x$, $y \leq 1$; hereinafter may be referred to simply as InGaAlP) mixed crystal, which has a lattice matching with a GaAs substrate, is considered most promising as a material that has a band gap of about 1.9 to 2.4 eV with a direct transition type band structure and is expected to cause highly-efficient light emission. The use of such a mixed crystal semiconductor is effective in producing LEDs with a heterojunction structure and high light emission efficiency. In fabricating such LEDs which emit light of a short wavelength, since the band gap energy of the substrate is always smaller than energy of emitted light, the substrate absorbs most of the irradiated light, thus significantly reducing the brightness. The same can be said to when the substrate is located on the side of the non-light-emitting face. That is, light emitted from the light-emitting layer and entering the substrate is not effectively guided outside.

As described above, LEDs with InGaAlP, serving as a light-emitting layer, which has a large band gap suitable for green light emission, do not have a sufficient light outputting efficiency due to light absorbed by the substrate.

SUMMARY OF THE INVENTION

It is therefore an object of the present invention to provide an LED which realizes a high light emission efficiency with InGaAlP as a light-emitting layer and a method of fabricating the same.

According to one aspect of the present invention, there is provided an LED comprising:

a light-emitting layer including a pn junction formed by a plurality of $In_xGa_yAl_{1-x-y}P$ ($0 \leq x$, $y \leq 1$) layers; and a light-emitting-layer holding layer consisting of an indirect transition type $Ga_{1-w}Al_wAs$ ($0 \leq w \leq 1$) and provided on an opposite side to a light-outputting side of the light-emitting layer.

According to another aspect of the present invention, there is provided a method of fabricating an LED, comprising the steps of:

depositing light-emitting layer, including a pn junction formed by a plurality of $In_xGa_yAl_{1-x-y}P$ ($0 \leq x$, $y \leq 1$) layers, on a substrate by vapor phase epitaxial growth;

depositing a light-emitting-layer holding layer, consisting of indirect transition type $Ga_{1-w}Al_wAs$ ($0 \leq w \leq 1$), on the light-emitting layer by vapor phase epitaxial growth; and removing the substrate.

Another LED fabricating method of the present invention comprises the steps of:

depositing a light-emitting-layer holding layer, consisting of indirect transition type $Ga_{1-w}Al_wAs$ ($0 \leq w \leq 1$), on a substrate by liquid phase epitaxial growth, and growing a thin GaAs protective layer on a surface of the light-emitting-layer holding layer;

heating and vaporizing the GaAs protective layer in a vapor phase chamber to expose a clean surface of the light-emitting-layer holding layer, and depositing a light-emitting layer, including a pn junction formed by a plurality of $In_xGa_yAl_{1-x-y}P$ ($0 \leq x$, $y \leq 1$) layers, on the exposed surface by vapor phase epitaxial growth; and removing the substrate.

According to the present invention, since a light-emitting-layer holding layer consisting of indirect transition type GaAlAs is provided for an InGaAlP light-emitting layer, the holding layer has sufficiently low light absorption of light emitted from the light-emitting layer though having a narrow band gap, thus providing an LED with a high light emitting efficiency.

According to the present method, after a light-emitting layer and a light-emitting-layer holding layer are sequentially deposited on a substrate by vapor phase epitaxial growth, or after the light-emitting layer is deposited by vapor phase epitaxial growth on the light-emitting-layer holding layer deposited on the substrate by liquid phase epitaxial growth, the substrate is removed, thereby providing an LED without a substrate that has great light absorption. Further, removing the substrate can relax stress on the light-emitting layer, so that the lift of the LED can expand by providing the lattice matching between the light-emitting layer and its holding layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view of an LED according to the first embodiment having a light-emitting layer with a double heterojunction structure fabricated by the first method;

FIG. 2 is a cross sectional view of an LED according to the second embodiment having a contact layer in addition to the structure of the first embodiment;

FIG. 3 is a diagram illustrating the light absorption coefficient of AlAs;

FIG. 4 is a cross sectional view of an LED according to the third embodiment having a light-emitting layer with a single heterojunction structure fabricated by the first method;

FIG. 5 is a cross sectional view of an LED according to the fourth embodiment having a light-emitting layer with a double heterojunction structure fabricated by the second method;

FIG. 6 is a cross sectional view of an LED according to the fifth embodiment in which an intermediate band gap layer is eliminated from the structure of the fourth embodiment and a contact layer is added thereto;

FIG. 7 is a cross sectional view of an LED according to the sixth embodiment in which an intermediate band gap layer is eliminated from the structure of the fourth embodiment;

FIG. 8 is a cross sectional view of an LED according to the seventh embodiment having a light-emitting layer with a double heterojunction structure;

FIG. 9 is a cross sectional view illustrating an LED according to the eight embodiment in which the contact layer of the seventh embodiment consists of InGaAlP;

FIG. 10 is a cross sectional view illustrating an LED according to the ninth embodiment in which the light-emitting layer of the seventh embodiment is modified to have a single heterojunction structure;

FIG. 11 is a cross sectional view illustrating an LED according to the tenth embodiment in which the contact layer of the seventh embodiment consists of GaAlAs; and FIG. 12 is a cross sectional view of an LED according to the eleventh embodiment with a light reflecting layer having a GaAlAs multi-layered structure.

DETAILED DESCRIPTION OF THE PREFERRED EMBODIMENTS

Figure 1:
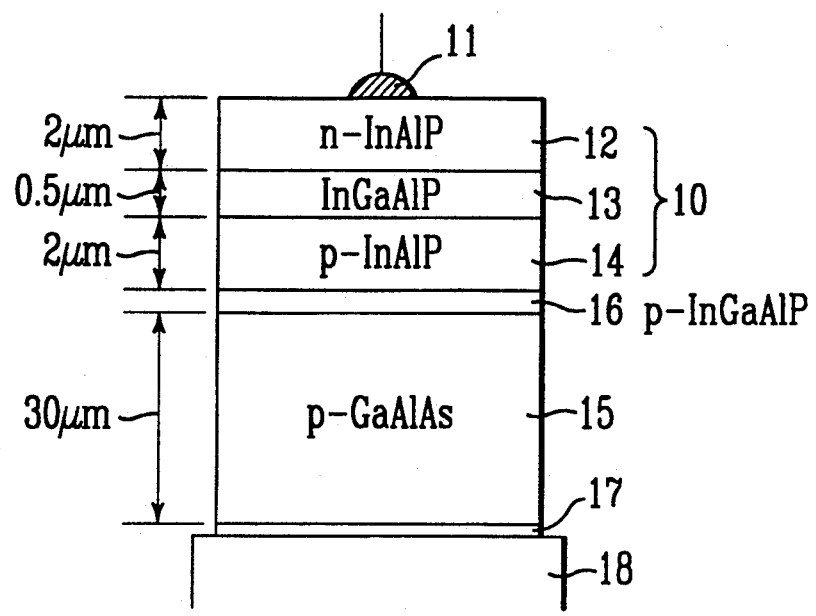
FIGS. 1 through 7 illustrate the structures of devices according to the present invention which has a light-emitting-layer holding layer.

FIG. 1 illustrates an LED with a double heterojunction structure according to the first embodiment. The non-light-emitting side of a light-emitting layer 10, which comprises an n-type InAlP clad layer 12, an undoped InGaAlP active layer 13 and a p-type InAlP clad layer 14, is held through a p-type InGaAlP intermediate band gap layer 16 by a light-emitting-layer holding layer (hereinafter referred to as LEL holding layer) 15. An n-side electrode 11 is formed on the surface of the clad layer 12. The LEL holding layer 15 is mounted via a p-side electrode 17 to a base 18.

This LED is fabricated by the following method. For instance, the n-type InAlP clad layer 12, undoped InGaAlP active layer 13 and p-type InAlP clad layer 14 are deposited through vapor phase epitaxial growth on a buffer layer on a GaAs substrate by the MOCVD method to thereby form the light-emitting layer 10. On this light-emitting layer 10, the p-type INGaAlP intermediate buffer layer 16 and p-type GaAlAs LEL holding layer 15 are sequentially deposited through vapor phase epitaxial growth also by the MOCVD method.

Then, the GaAs substrate is removed and electrodes are formed to make the substrate-removed side as a light outputting face. The opposite side is then mounted on the base 18.

Figure 3:
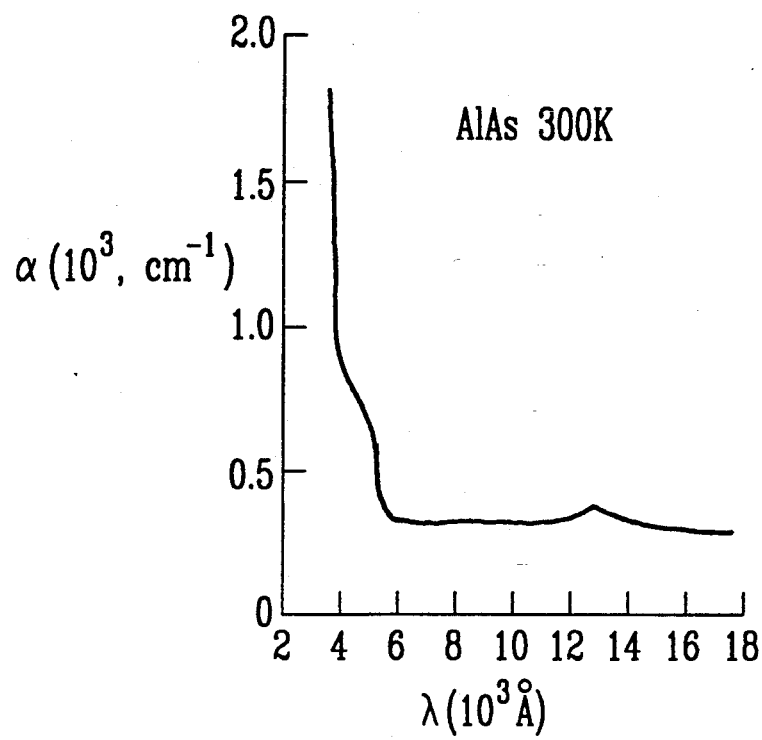

FIG. 3 illustrates the light absorbing coefficient of AlAs as an indirect transition semiconductor in a visible light range. Although the band gap is 2.1 eV and not large, the light absorbing coefficient in the range of green wavelength is small due to the indirect transition type. Although an increase in light absorption from approximately 550 nm is recognized, the increase is not as sharp as the one attained by a direct transition type semiconductor and can therefore be said to be almost transparent at 550 nm. From this, GaAlAs having much Al composition is also transparent in the range of green wavelength.

As a result, the LED of this embodiment emits green light emission with high light emission efficiency.

More specific fabrication processes for this embodiment will be described below. The crystal growth is carried out by the MOCVD method using, as raw materials, trimethylindium (TMI), trimethylgallium (TMG) and trimethylaluminum (TMA) as methyl-based organic metals of the group III, arsine (AsH$_3$) and phosphine (PH$_3$) as hydrides of the group V. With hydrogen as carrier gas, the raw materials are fed to a reaction tube and crystal is grown on the substrate placed on an SiC-coated graphite susceptor. The pressure in the reaction tube is 0.3 to 1.0 atm with the total flow rate of approximately 1 l/min, and the substrate is subjected to induction heating to about 700° C. As this substrate, an Si-doped n-type (100) GaAs substrate with a carrier concentration of $3 \times 10^{18}/cm^3$ was used.

First, an n-type GaAs buffer layer (Si doped; $2 \times 10^{18}/cm^3$) is grown 2 μm thick on the substrate. Then, a 2 μm thick n-type In$_{0.5}$Al$_{0.5}$P clad layer 12 (Se doped; $1 \times 10^{18}/cm^3$), 0.5-μm thick undoped In$_{0.5}$Ga$_{0.25}$Al$_{0.25}$P active layer 13 and 2-μm thick p-type In$_{0.5}$Al$_{0.5}$P clad layer 14 (Mg doped; $1 \times 10^{18}/cm^3$) are sequentially grown. On the top of the resultant structure, a p-type In$_{0.5}$Ga$_{0.2}$Al$_{0.3}$P intermediate band gap layer 16 (Mg doped; $3 \times 10^{18}/cm^3$) is grown 1000 angstrom thick, followed by the growing of a p-type In$_{0.2}$Al$_{0.8}$P LEL holding layer 15 (MG doped; $3 \times 10^{18}/cm^3$) 30 μm thick. Thereafter, the GaAs substrate and the overlying GaAs buffer layer are completely removed by mechanical polishing and etching. In the etching was used an etchant having a mixture of 28% ammonium water, 35% hydrogen peroxide water and water in the composition ratio of 1:30:9. After removal of the substrate side, In electrodes 11 and 17 were formed and the resultant structure is mounted on the base 18 with the substrate-removed face being a light emitting face.

GaAlAs of the LEL holding layer has a large Al concentration of 0.8 and is indirect transition type and the absorbing coefficient at the wavelength of emitted light of the device is as small as about $5 \times 10^2/cm$. The intermediate buffer layer 16 is used to make the transition of the band gap smoother. The resultant LED emitted green light with a brightness of about 50 mcd. In this embodiment, the light outputting side is made n type which permits high concentration doping, which improves the current spreading and assures the formation of an ohmic electrode.

Figure 2:
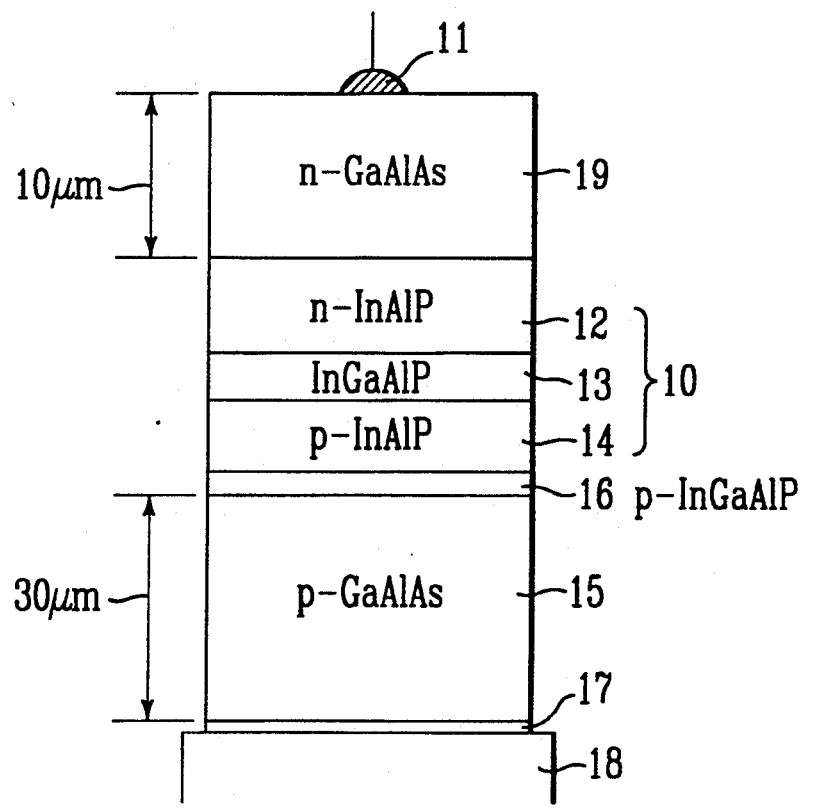

FIG. 2 illustrates the second embodiment which is a slight modification of the first embodiment. In the second embodiment, after a GaAs buffer layer is formed on a GaAs substrate, a GaAlAs second buffer layer 19 is further grown 10 μm, and a light-emitting layer and LEL holding layer are formed on the resultant structure as per the first embodiment. The resultant LED chip is mounted on the base with the second buffer layer 19 left on the light outputting side.

In this embodiment, the n-type second buffer layer 19 serves as a contact layer which allows current spreading on the light outputting side and the formation of the ohmic electrode surer. The second buffer layer or contact layer 19 substantially is transparent to the wavelength of emitted light.

Figure 4:
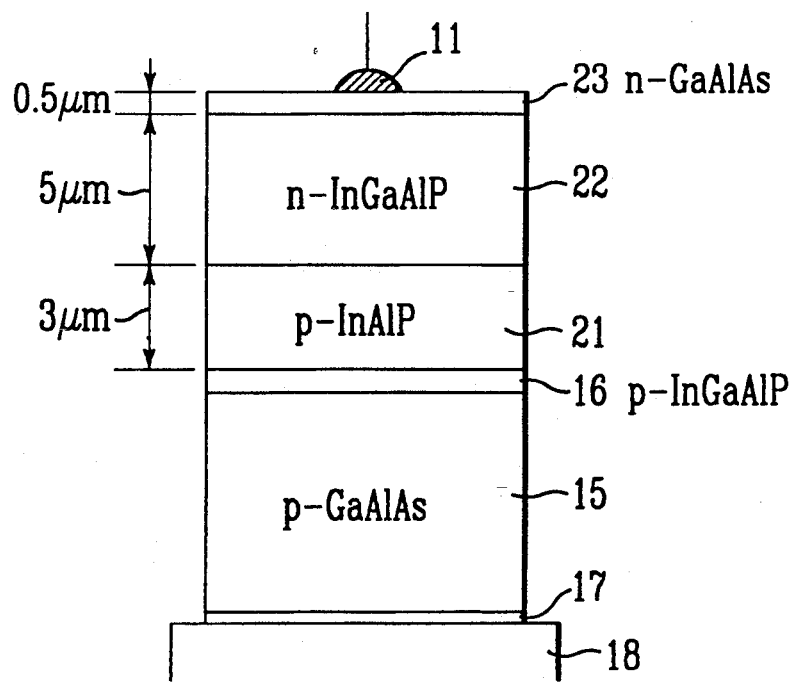

FIG. 4 illustrates the third embodiment which uses a single heterojunction structure for the light-emitting layer 10. On the GaAs substrate are grown a GaAs buffer layer and a GaAlAs second buffer layer 23 followed by the growing of an n-type InGaAlP layer 22 (5 μm thick with a carrier concentration of $3 \times 10^{17}/cm^3$) and a p-type InAlP layer 21 (3 μm thick with a carrier concentration of $1 \times 10^{18}/cm^3$). The subsequent processes are the same as those of the previous embodiment. The GaAs substrate and GaAs buffer layer are also removed followed by the formation of an electrode, and the resultant LED chip is mounted on the base 18. The n-type GaAlAs second buffer layer 23 is left as the contact layer. This second buffer layer 23 has a thickness of 0.5 μm and a carrier concentration of $2 \times 10^{18}/cm^3$.

This embodiment can also provide green light emission with high brightness.

Figure 5:
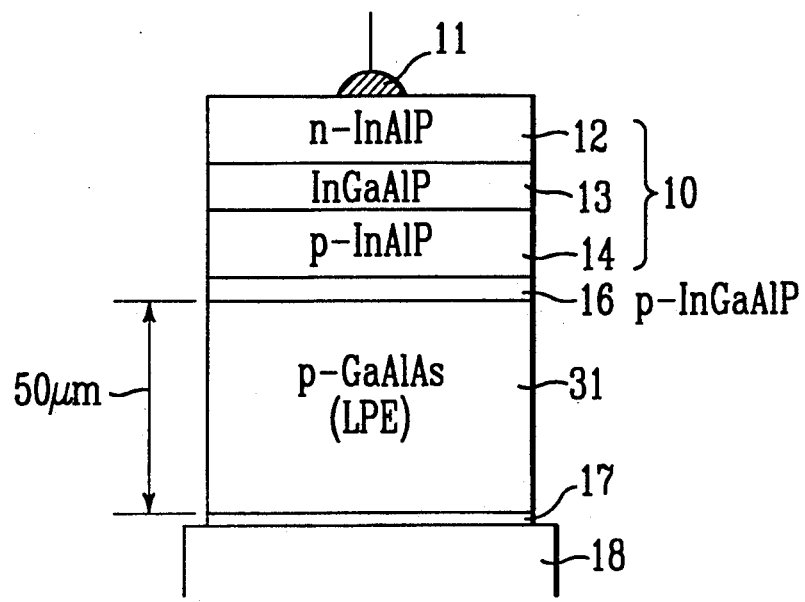

FIG. 5 illustrates an LED according to the fourth embodiment. In this embodiment the step of forming a thick LEL holding layer by the MOCVD method is eliminated. In other words, an LEL holding layer 31 consisting of p-type GaAlAs is deposited 50 to 100 μm thick on the GaAs substrate by a liquid phase epitaxial growth method (LPE method). An intermediate band gap layer 16 is deposited on the layer 31 by the MOCVD method, followed by the deposition of a light-emitting layer 10 including a p-type clad layer 14, an active layer 13, and an n-type clad layer 12. With the GaAs substrate removed and electrodes formed on the resultant structure to thereby constitute an LED chip, this LED chip is then mounted on the base 8.

More specific processes of fabricating the LED of this embodiment will be now described. For instance, an LEL holding layer 31, consisting of thick p-type $Ga_{0.2}Al_{0.8}As$, is deposited on the p-type GaAs substrate (Zn doped with a carrier concentration of $3 \times 10^8/cm^3$) by the LPE method. On the surface of the resultant structure, a GaAs protective layer is deposited 100 angstroms to prevent the oxidation of Al. Then, this wafer is placed in an MOCVD device, and is heated under a low-pressured atmosphere, evaporating the GaAs layer, and exposing a clean surface of the $Ga_{0.2}Al_{0.8}As$. An InGaAl p-type intermediate band gap layer 16 for causing smooth transition of the band gap is deposited on the exposed surface. The light-emitting layer 10 is then formed through the vapor phase epitaxial growth of a p-type $In_{0.5}Al_{0.5}P$ clad layer 14 in 2 μm (Mg doped with a carrier concentration of $1 \times 10^{18}/cm^3$), a 0.5 μm thick undoped $In_{0.5}Ga_{0.25}Al_{0.25}P$ active layer 13, and a 3 μm thick n-type $In_{0.5}Al_{0.5}P$ clad layer 12 (Se doped with a carrier concentration of $1 \times 10^{18}/cm^3$ in the named order. Finally, electrodes 11 and 17 are formed after removing the GaAs substrate, and the resultant structure is mounted on the base 18, with the LEL holding layer at the bottom.

According to this embodiment, since the LEL holding layer consisting of GaAlAs is formed by the LPE method, a thick LEL holding layer can easily be provided. With a process of forming a thick GaAlAs LEL holding layer and depositing a light-emitting layer thereon only by the MOCVD method, however, it is not only difficult to provide a thick light-emitting layer but also it is not possible to attain a GaAlAs layer with a good surface condition, so that the light-emitting layer has poor crystallinity. In this embodiment, the combination of MOCVD and LPE methods makes it possible to gain a thick LEL holding layer as a base of the light-emitting layer.

Figure 6:
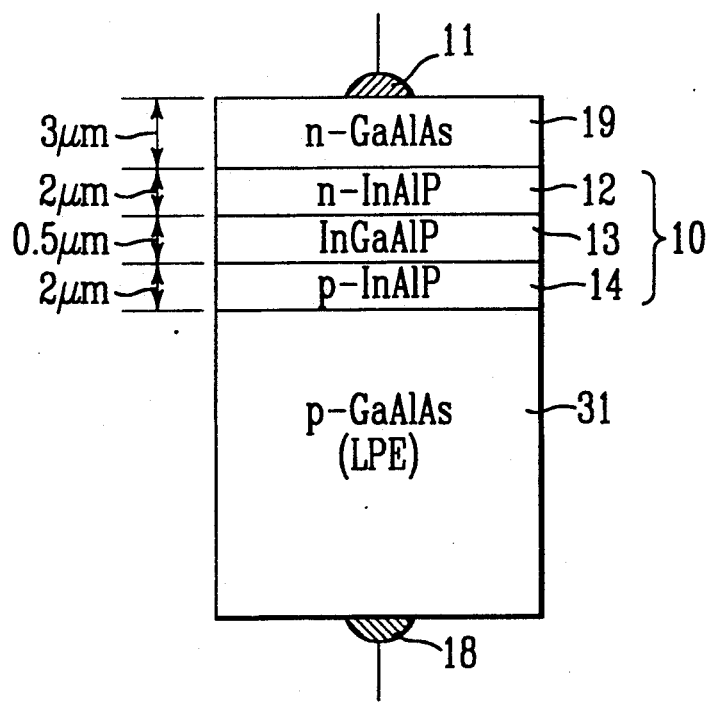

FIG. 6 illustrates the fifth embodiment which is a slight modification of the one shown in FIG. 5. In this embodiment, an n-type GaAlAs contact layer 19 is formed on the light-emitting layer 10. The GaAlAs contact layer 19 has only to be as thick as 3 μm, and can be easily grown by the MOCVD method. The intermediate band gap layer 16 in FIG. 5 is omitted in this embodiment. The provision of the contact layer 19 ensures uniform distribution of current density and facilitates the formation of the electrodes.

Figure 7:
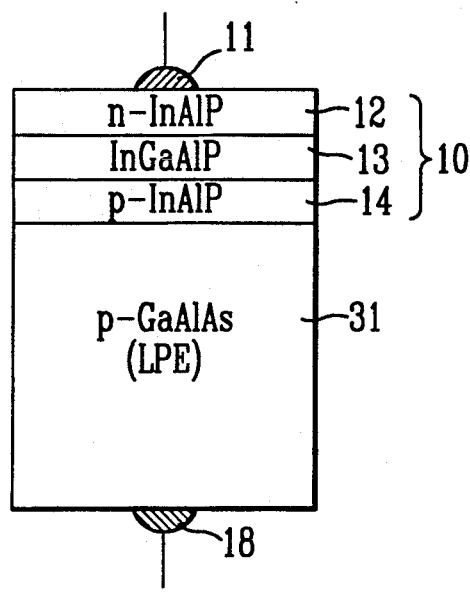

FIG. 7 shows the sixth embodiment which is also a slight modification of the one shown in FIG. 5; in the sixth embodiment the intermediate layer 16 is omitted, so is the contact layer shown in FIG. 6. Since the n-type InAlP clad layer 12 permits high concentration doping, the current spreading is sufficient and good ohmic electrodes can be formed without positively providing a contact layer.

According to the first through six embodiments, the indirect transition type GaAlAs LEL holding layer is provided for the light-emitting layer including an InGaAlP layer to eliminate the influence of light absorption of the substrate, thus providing a green light-emitting LED with high light-emitting efficiency. In these embodiments, combination of other elements in the group III or V, or the reduction of compositions is possible as needed in order to improve the lattice matching between the individual layers. The shape, number, and arrangement of electrodes and the plane orientation of the substrate can be modified in various manners.

Further, according to the present invention, the light emitted toward the substrate side from the light-emitting layer can be reflected to the light outputting side by providing a light-reflecting layer, instead of the LEL holding layer, between the light-emitting layer and the substrate. This light reflection can prevent absorption by the GaAs substrate with a narrow band gap, which is the main cause of light absorption. The following will describe the seventh to eleventh embodiments provided with a light reflecting layer.

A multiple film (layers-stacked film) having different compositions is used as a light reflecting layer; the cycle of the alternately-stacked layers is set about the wavelength of emitted light. To improve the reflection factor, it is desirable that the cycle of the alternately-stacked layers be $\lambda/2$, $\lambda/8$, $2\lambda$, and so forth with respect to the wavelength of emitted light, $\lambda$. If the band gap of the contact layer is increase to be transparent to the emitted light in order to reduce the light absorption in the contact layer, the light emitting efficiency can be enhanced further. Using an indirect transition type semiconductor material even with a small band gap in place of a contact layer with a large band gap can however reduce the light absorption and facilitate the layer growth on the light-emitting layer.

Figure 8:
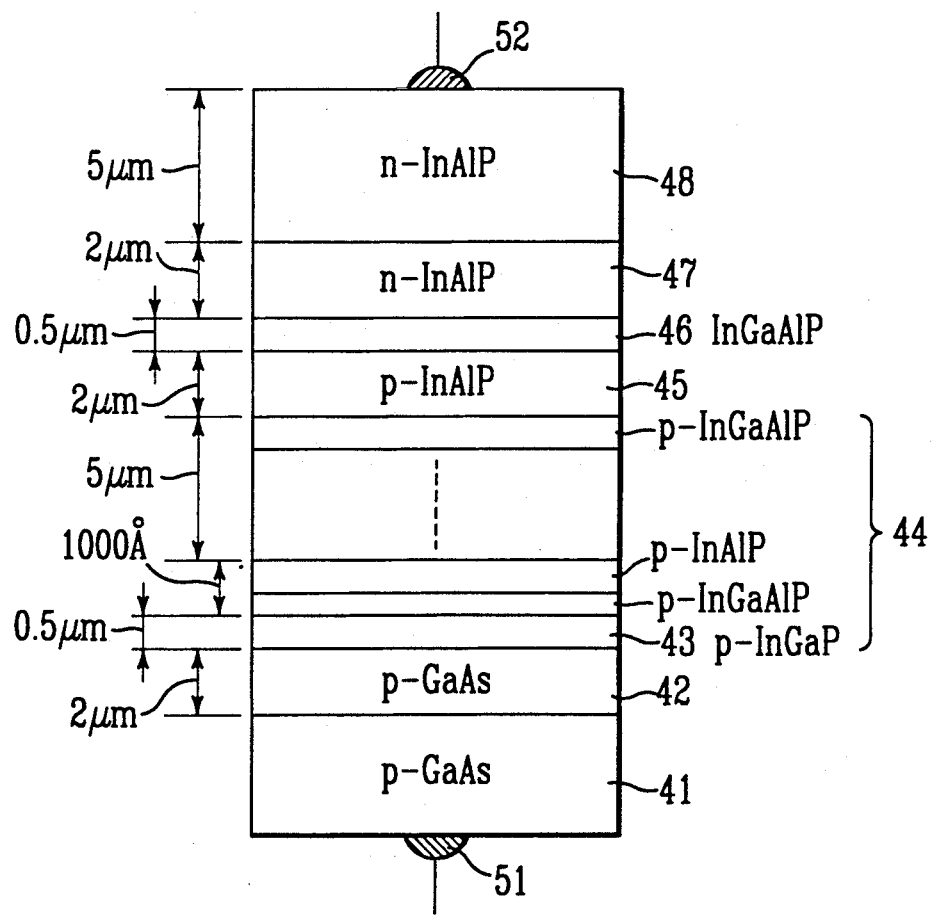
FIGS. 8 through 12 illustrate the structures of a device according to the present invention which has a light reflecting layer in place of a light-emitting-layer holding layer.

FIG. 8 is a cross-sectional view illustrating the schematic structure of an LED according to the seventh embodiment of the present invention in which a light reflecting layer is provided between the substrate and light-emitting layer to prevent the substrate from absorbing light.

On a p-type GaAs substrate 41 a p-type GaAs buffer layer 42 and a p-type InGaP intermediate band gap layer 43 are deposited. Deposited on this intermediate band gap layer 43 is a light reflecting layer 44 having a multi-layer structure of p-type InAlP and p-type InGaAlP layers. On the light reflecting layer 44 is deposited a light-emitting layer having a double heterojunction structure, which comprises a p-type InAlP clad layer 45, an InGaAlP active layer 46 and an n-type InAlP clad layer 47. An n-type InAlP contact layer 48 is deposited on this light-emitting layer. Referring to FIG. 8, reference numeral "51" is a p-side electrode (light outputting side electrode) and reference numeral "52" an n-side electrode.

The intermediate band gap layer 43 serves to prevent the ohmic connection from being hindered by a large band gap difference between the buffer layer 42 and light reflecting layer 44. The light reflecting layer 44 is made to have a lamination cycle of about ¼ of the wavelength of emitted light in order to enhance the reflection factor. The band gap of the contact layer 48 is set greater than that of the active layer 46 so that it becomes transparent to the wavelength of emitted light.

The method of fabricating the above device will now be specifically described. The individual semiconductor layers were grown by the metal organic chemical vapor deposition (MOCVB) method. The crystal growth is carried out by the MOCVD method using, as raw materials, trimethylindium (TMI), trimethylgallium (TMG) and trimethylaluminum (TMA) as methyl-based organic metals of the group III, arsin ($AsH_3$) and phosphine ($PH_3$) as hydrides of the group V. With hydrogen as carrier gas, reactive gas is supplied to a quartz reaction tube and crystal was grown on the substrate placed on an SiC-coated graphite susceptor. The pressure in the reaction tube is 0.3 to 1.0 atm and the substrate is subjected to high-frequency heating to about 700° C. As this substrate, Zn-doped p-type GaAs with a carrier concentration of $3 \times 10^{18}$ cm$^{-3}$ was used. The orientation of the substrate is (100).

First, on the p-type GaAs substrate a p-type GaAs (Zn doped; $3 \times 10^{18}$ cm$^{-3}$) buffer layer 42 is deposited 2 μm thick and the p-type $In_{0.5}Ga_{0.5}P$ (Zn doped; $3 \times 10^{18}$ cm$^{-3}$) intermediate band gap layer 43 is deposited 0.5 μm thick. The latter layer is to have a band gap between GaAs and InAlP bad gaps, and prevents non-ohmic connection due to a large band gap. On the layer is deposited the 5 μm thick light reflecting layer 44 which has an alternate lamination of a p-type $In_{0.5}Al_{0.5}P$ layer and p-type $In_{0.5}Ga_{0.2}Al_{0.3}P$. This portion is Zn-doped and has a carrier concentration of $1 \times 10^{18}$ cm$^{-3}$, and the alternate lamination is made with 1000 angstroms, a lamination cycle of about 178 of the wavelength of a semiconductor, in order to reflect emitted light efficiently.

Then, on the light reflecting layer 44 is formed a double heterojunction structure comprising a 2 μm thick p-type $In_{0.5}Al_{0.5}P$ clad layer 45 (Zn doped; $1 \times 10^{18}$ cm$^{-3}$), 0.5-μm thick undoped $In_{0.5}Ga_{0.25}$ $Al_{0.25}P$ active layer 46 and 2-μm thick n-type $In_{0.5}Al_{0.5}P$ clad layer 47 (Se doped; $1 \times 10^{18}$ cm$^{-3}$). Then, an n-type $In_{0.5}Al_{0.5}P$ contact layer (Se doped; $3 \times 10^{18}$ cm$^{-3}$) 48 transparent to the wavelength of emitted light is grown 5 μm thick. Finally, In electrodes 51 and 52 are formed on the back of the substrate 41 and the top of the contact layer 48, completing an LED which emits light in a green region.

According to the thus fabricated LED, light generated from the light-emitting layer having a double heterojunction structure travels toward both the side of the n-side electrode (light outputting side electrode) 52 and the side of the substrate 41. The light going toward the substrate side is reflected efficiently at the light reflecting layer 44 and travels to the light-outputting side electrode 52. It is therefore possible to prevent light absorption by the substrate 41, thus realizing a green LED with a significantly improved brightness of about 50 mcd as compared with the case having no light reflecting layer 44. Further, permitting the light-outputting side electrode (contact layer 48) to be an n-type that facilitates high-concentration doping can realize an excellent device with current spreading.

According to the embodiment, as described above, an LED with high brightness capable of emitting light in a green region could be prepared, without using a special substrate, by depositing the light reflecting layer 44 with a multi-layer structure, which suppresses light absorption, on a high-quality and inexpensive GaAs substrate having a relatively narrow band gap, and further depositing the light-emitting layer (45–47) consisting of InGaAlP. Mass production of green LEDs at a relatively low cost by the above method can greatly contribute to the information industry, such as optical communications.

Although the cycle of the alternate lamination of the light reflecting layer having a multi-layer structure is set to about ¼ in this embodiment, the cycle may also be set to 2/1, 1/1, ¼ or ⅛ with the same effect and the thickness of the light reflecting layer is sufficient to be about 3 μm. Further, the contact layer has only to have a composition to be transparent to the wavelength of emitted light.

FIGS. 9 through 12 are cross-sectional views schematically illustrating the respective structures of the eighth to eleventh embodiments of the present invention.

Figure 9:
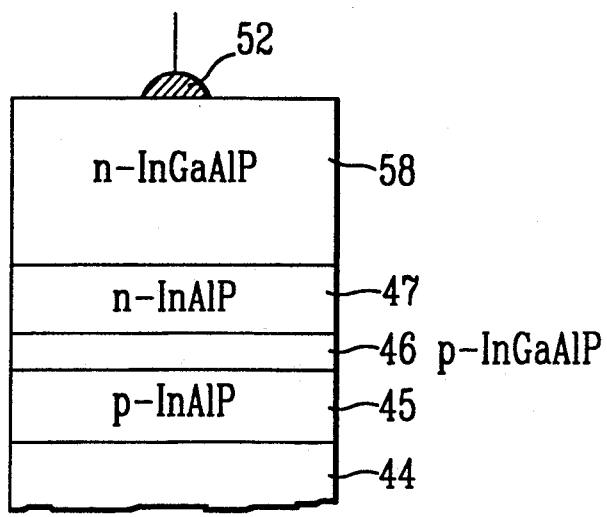

The eighth embodiment in FIG. 9 is the embodiment shown in FIG. 8 modified so that the contact layer, last grown, is replaced a 5 μm thick n-type InGaAlP (Se doped; $3 \times 10^{18}$ cm$^{-3}$) having a composition transparent to the wavelength of emitted light. The composition of this contact layer 58 is $In_{0.4}Ga_{0.2}Al_{0.4}P$ whose growth is easier than InAlP. All the other layers are the same as those of the previous embodiment.

Figure 10:
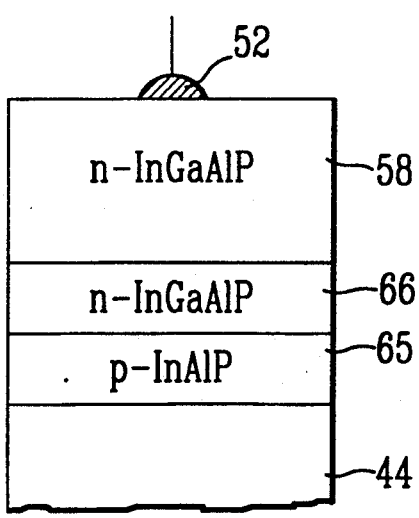

The light-emitting layer of the ninth embodiment shown in FIG. 10 has a single heterojunction structure including a 2 μm thick p-type $In_{0.5}Al_{0.5}P$ (Zn doped; a carrier concentration of $5 \times 10^{17}$ cm$^{-3}$) 65 and a 2 μm thick n-type $In_{0.5}Ga_{0.25}Al_{0.25}P$ (Se doped: a carrier concentration of $2 \times 10^{16}$ cm$^{-3}$) 66, not a double heterojunction structure. In this case, the structure is more simplified so that the LED with no absorption loss has been rather easily obtained. A contact layer 58 is an n-type InGaAlP which is easier to grow than InAlP as per the embodiment in FIG. 8.

Figure 11:
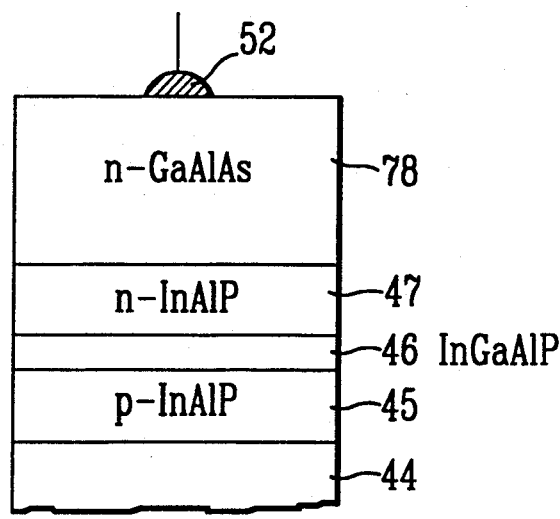

In the tenth embodiment in FIG. 11, a n-type GaAlAs (Se doped; a carrier concentration of $5 \times 10^{18}$ cm$^{-3}$ and a thickness of 3 μm) contact layer 78 is used in place of the contact layer of the embodiment shown in FIG. 8. The contact layer 78 has $Ga_{0.2}Al_{0.8}As$, greater Al composition, and a wider band gap than GaAs. This composition provides an indirect transition type and makes the absorption coefficient smaller, which is about $5\times10^2$ cm$^{-1}$, merely 1/100 of GaAs. That is, although the band gap of the contact layer 78 is smaller than the band gap corresponding to the wavelength of emitted light, light absorption in the contact layer 78 can be reduced significantly due to the indirect transition type.

In this embodiment, using the fast-growing GaAlAs for the contact layer 78 can facilitate the fabrication of the device, and thus reduces the cost. This method could also produce LEDs with high brightness. Part of this layer may be removed as needed to further reduce the light absorption.

Figure 12:
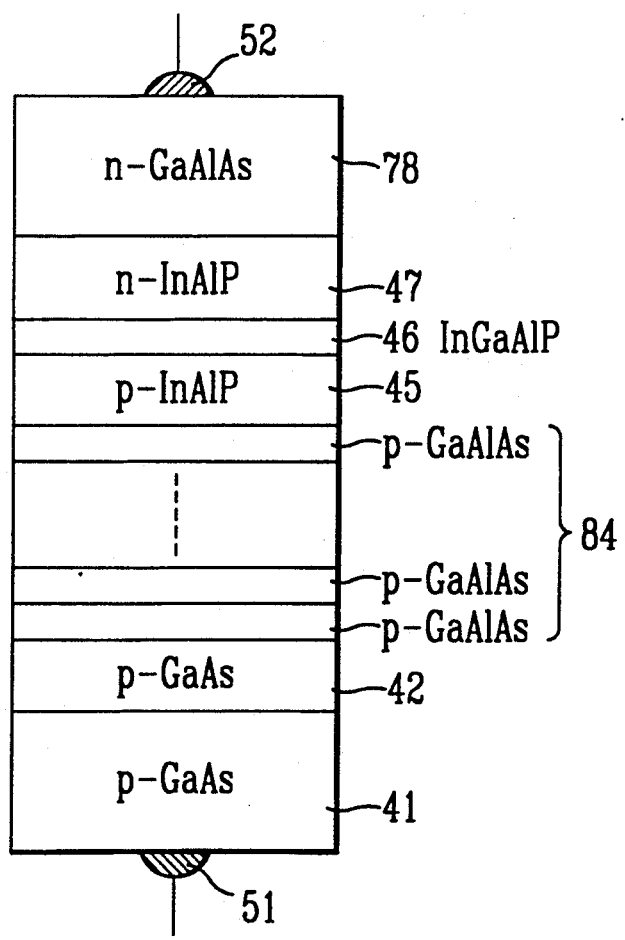

In the eleventh embodiment in FIG. 12 the composition of the light reflecting layer is changed: a light reflecting layer 84 having a multi-layer structure of a p-type $Ga_{0.3}Al_{0.7}As$ and a p-type $Ga_{0.2}Al_{0.8}As$ both Zn-doped and having a carrier concentration of $2\times10^{18}$ at a cycle of 1000 angstroms. The light-emitting layer has the same structure as that of the seventh embodiment shown in FIG. 8. The GaAlAs layer when made to have an alternate lamination structure can serve to reflect light with high efficiency. Since growing of InAlP which does not help grow a thick film can be avoided as much as possible by making the contact layer 78 n-type GaAlAs, the manufacturing cost can be further reduced. As the band gap of GaAlAs is smaller than that of InGaAlP but greater than GaAs, it is unnecessary to form an intermediate band gap layer between the light reflecting layer 84 and substrate 41.

In the seventh to eleventh embodiments, the shape, number, and arrangement of electrodes, the orientation of the substrate, and further the thickness of the semiconductor layer can be modified in various manners as needed according to the specification. The structure of the light-emitting layer portion is not restricted to a heterojunction structure but may be a homojunction. The InGaP intermediate band gap layer is formed to prevent the ohmic connection from being hindered by the large band gap difference between the GaAs substrate and InGaAsP of the light-emitting layer. Other semiconductors having a band gap between these two layers can also be utilized. Further, a method of changing the composition of the buffer layer from that of the clad layer to provide a concentration gradation is also effective.

It is possible to use a InGaAlP clad layer having a composition transparent to the wavelength of emitted light in place of the InAlP clad layer. Further, Sb may be mixed, or P or In may be mixed in the GaAs layer or GaAlAs layer in order to improve the lattice matching of the individual layers or select a band gap. Alternately, InGaAlP may be replaced with InGaP.

According to the seventh to eleventh embodiments, as described above, the light reflecting layer is formed between the substrate and light-emitting layer to reflect light going to the substrate side toward the light-outputting side to thereby solve low light outputting efficiency, and absorption of emitted light by the substrate can be reduced, thus realizing a semiconductor light-emitting device which can enhance the brightness.

Additional advantages and modifications will readily occur to those skilled in the art. Therefore, the invention in its broader aspects is not limited to the specific details, representative devices, and illustrated examples shown and described herein. Accordingly, various modifications may be without departing from the spirit or scope of the general inventive concept as defined by the appended claims and their equivalents.

What is claimed is:

1. A light emitting diode, comprising:
    a light-emitting layer comprising p-type and n-type $In_xGa_yAl_{1-x-y}P$ ($0\leq x\leq 1$, $0\leq y\leq 1$) layers;
    a first electrode provided on a light-outputting side of the light-emitting layer;
    a first contact layer interposed between the light-emitting layer and the first electrode, the first contact layer being made of a group III-V compound semiconductor of the indirect transition type;
    a second electrode provided on an opposite side to the light-outputting side of the light-emitting layer; and
    a second contact layer interposed between the light-emitting layer and the second electrode, the second contact layer being made of a group III-V compound semiconductor.

2. The diode according to claim 1, wherein the III-V compound semiconductor forming the first contact layer has a band gap which is smaller than band gaps of the $In_xGa_yAl_{1-x-y}P$ layers of the light-emitting layer.

3. The diode according to claim 2, wherein the III-V compound semiconductor forming the first contact layer contains a substantial amount of Al as a group III element.

4. The diode according to claim 3, wherein the III-V compound semiconductor forming the first contact layer consists of GaAlAs.

5. The diode according to claim 2, wherein the light-emitting layer further comprises an undoped $In_xGa_yAl_{1-x-y}P$ ($0x\leq 1$, $0\leq y\leq 1$) layer interposed between the p-type and n-type $In_xGa_yAl_{1-x-y}P$ layers.

6. The diode according to claim 2, wherein the light-emitting layer consists of the p-type and n-type $In_xGa_yAl_{1-x-y}P$ layers.

7. The diode according to claim 2, wherein the III-V compound semiconductor forming the second contact layer is of the indirect transition type and has a band gap which is smaller than the band gaps of the $In_X Ga_Y Al_{1-X-Y}P$ layers of the light-emitting layer.

8. The diode according to claim 2, wherein a light-reflecting layer is arranged between the light-emitting layer and the second contact layer and is formed by a plurality of stacked group III-V compound semiconductor layers.

9. A light emitting diode, comprising:
    a light-emitting layer comprising p-type and n-type $In_xGa_yAl_{1-x-y}P$ ($0\leq x\leq 1$) ($0\leq y\leq 1$) layers;
    a first electrode provided on a first light-outputting side of the light-emitting layer;
    a first contact layer interposed between the light-emitting layer and the first electrode, the first contact layer being made of a group III-V compound semiconductor of the indirect transition type;
    a second electrode provided on a second light-outputting side opposite to the first light-outputting side of the light-emitting layer; and
    a second contact layer interposed between the light-emitting layer and the second electrode, the second contact layer being made of a group III-V compound semiconductor of the indirect transition type.

10. The diode according to claim 9, wherein each of the III-V compound semiconductors respectively forming the first and second contact layers has a band gap which is smaller than band gaps of the $In_xGa_yAl_{1-x-y}P$ layers of the light-emitting layer.

11. The diode according to claim 10, wherein each of the III-V compound semiconductors respectively forming the first and second contact layers contains a substantial amount of Al as a group III element.

12. The diode according to claim 11, wherein each of the III-V compound semiconductors respectively forming the first and second contact layers consists of GaAlAs.

13. The diode according to claim 10, wherein the light-emitting layer further comprises an undoped $In_x$-$Ga_yAl_{1-x-y}P$ ($0 \leq x \leq 1$, $0 \leq y \leq 1$) layer interposed between the p-type and n-type $In_xGa_yAl_{1-x-y}P$ layers.

14. The diode according to claim 10, wherein the light-emitting layer consists of the p-type and n-type $In_xGa_yAl_{1-x-y}P$ layers.

15. A light emitting diode, comprising: a light-emitting layer comprising p-type and n-type $In_xGa_yAl_{1-x-y}P$ ($0 \leq x \leq 1$, $0 \leq y \leq 1$) layers;

a first electrode provided on a light-outputting side of the light-emitting layer;

a second electrode provided on an opposite side to the light-outputting side of the light-emitting layer; and a contact layer interposed between the light-emitting layer and the first electrode, the contact layer being made of a group III-V compound semiconductor of the indirect transition type.

* * * * *

UNITED STATES PATENT AND TRADEMARK OFFICE
CERTIFICATE OF CORRECTION

PATENT NO. : 5,317,167
DATED : May 31, 1994
INVENTOR(S) : Toshihide IZUMIYA, et al.

It is certified that error appears in the above-indentified patent and that said Letters Patent is hereby corrected as shown below:

On the title page, Item [21], the Application Number should read as follows:

--58,221--

Signed and Sealed this

Thirtieth Day of August, 1994

Attest:

BRUCE LEHMAN

Attesting Officer

Commissioner of Patents and Trademarks